United States Patent [19]

Hagino

[11] Patent Number: 5,380,670
[45] Date of Patent: Jan. 10, 1995

[54] METHOD OF FABRICATING A SEMICONDUCTOR DEVICE

[75] Inventor: Hiroyasu Hagino, Fukuoka, Japan

[73] Assignee: Mitsubishi Denki Kabushiki Kaisha, Tokyo, Japan

[21] Appl. No.: 190,494

[22] Filed: Feb. 2, 1994

Related U.S. Application Data

[62] Division of Ser. No. 767,480, Sep. 30, 1991, Pat. No. 5,304,821.

[30] Foreign Application Priority Data

Oct. 8, 1990 [JP] Japan .................. 2-270733

[51] Int. Cl.⁶ ............................ H01L 21/265
[52] U.S. Cl. ............................ 437/31; 437/6; 437/203; 437/911; 148/DIG. 126
[58] Field of Search ............ 437/31, 6, 203, 911; 148/DIG. 126; 437/32, 40, 41

[56] References Cited

U.S. PATENT DOCUMENTS

| | | | |
|---|---|---|---|
| 4,799,095 | 1/1989 | Baliga | 257/135 |
| 4,872,044 | 10/1989 | Nishizawa et al. | 257/136 |
| 4,898,835 | 2/1990 | Cawlfield | 437/26 |
| 5,086,007 | 2/1992 | Ueno | 437/67 |
| 5,173,435 | 12/1992 | Harada | 437/31 |
| 5,202,750 | 4/1993 | Gough | 257/133 |

*Primary Examiner*—Brian E. Hearn
*Assistant Examiner*—Tuan Nguyen
*Attorney, Agent, or Firm*—Oblon, Spivak, McClelland, Maier, & Neustadt

[57] ABSTRACT

An N+ buffer layer (2) and an N− layer (3) are provided on a P+ silicon substrate (1) in this order. On an upper portion of the N− layer (3), a P− layer (4b) is selectively formed, and on the P− layer (4b), a P+ layer (4a) is provided. On part of a top surface of the P+ layer (4a), a plurality of N+ layers (5a) are provided, and a trench (13) is formed extending through each of the N+ layers (5a) and P+ layer (4a) downwards to the P− layer (4b). In the P− layer (4b), an N+ floating layer (5b) is provided covering the bottom face of each trench (13). In the inner hollow of the trench (13), a gate electrode (8a) is provided through a gate oxidation film (7a), while an emitter electrode (9a) is provided extending between the top surfaces of the adjacent N+ layers (5a) with the surface of the P+ layer (4a) interposed so as to electrically short circuit them. A collector electrode (10) is provided on a lower major surface of the P+ substrate (1). When a higher potential than that of the emitter electrode (9a) is applied to the gate electrode (8a) with forward bias being applied between the electrodes (9a) and (10) so that the collector electrode (10) may be higher in potential than the emitter electrode (9a), the channel region (6a) turns to the N-type, and electrons move from the N+ layers (5a) through 26e channels (6a) to the N+ floating layers (5b).

11 Claims, 10 Drawing Sheets

METHOD OF FABRICATING A SEMICONDUCTOR DEVICE

This is a division, of application Ser. No. 07/767,480, filed on Sep. 30, 1991, now U.S. Pat. No. 5,304,821.

BACKGROUND OF THE INVENTION

1. Field of the Invention

The present invention relates to an insulated-gate bipolar semiconductor device and a method of manufacturing the same.

2. Description of the Prior Art

Figure 4:
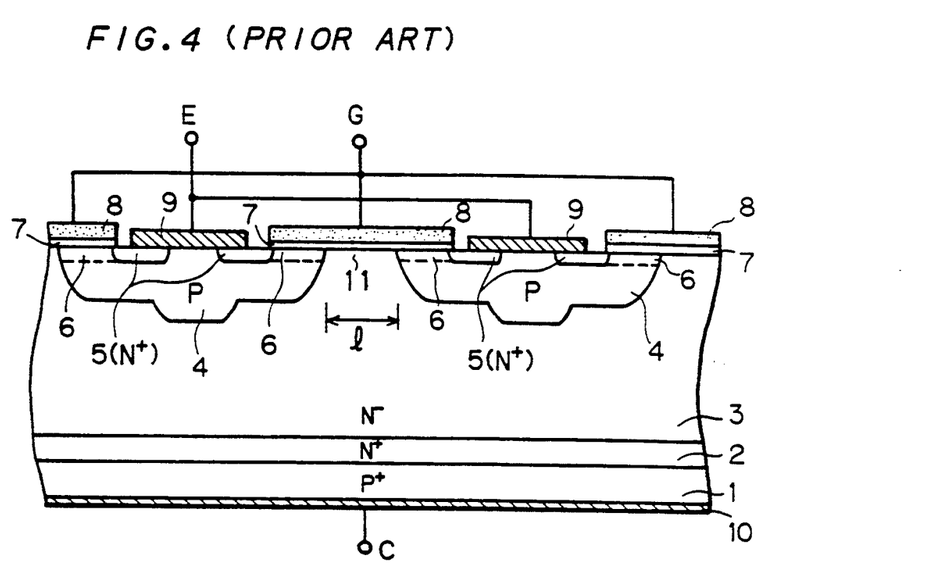
FIGS. 4 and 5 are sectional views showing conventional IGBTs.

FIG. 4 is a sectional view showing a conventional insulated-gate bipolar transistor (IGBT). On an upper major surface of a P+ silicon substrate 1, an N+ buffer layer 2 and an N− drain layer 3 are formed in this order by, for example, epitaxial growth. P base regions 4 are formed on a surface of the N− layer 3 by selective diffusion or the like; and further, N+ emitter regions 5 are formed in each of the P base regions 4 by selective diffusion or the like. On a region 11 between the P regions 4 adjacent to each other in the N− drain layer 3, a gate electrode 8 is formed with interposition of a gate oxidation film 7, extending near the N+ emitter regions 5. An emitter electrode 9 is provided on both the N+ emitter regions 5 and the P+ base region 4 lying between the N+ emitter regions 5, in ohmic contact. On a lower major surface of the P+ substrate 1, a collector electrode 10 is provided in ohmic contact.

Now, the operation of the IGBT will be simply described. When voltage which is higher to some extent than the emitter potential is applied to a gate electrode 8 with forward bias voltage applied between the emitter electrode 9 and the collector electrode 10, a channel region 6 lying between each of the N+ emitter regions 5 and N− drain layer 3 and located just under the gate electrode 8 is inverted to the N-type. Then, electrons move from the N+ emitter region 5 through the channel region 6 into the N− drain layer 3. In accord with it, holes move from the P+ substrate 1 through the N+ buffer layer 2 into the N− drain layer 3, and eventually, the emitter electrode 9 and the collector electrode 10 become conductive with each other.

It is desirable that voltage between the emitter electrode 9 and the collector electrode 10 which are conductive with each other (referred to as "ON-voltage" hereinafter) is low, but to reduce the ON voltage, it is necessary to make the design by which current passing through the region 11 to the N− drain layer 3 in the vertical direction can flow more easily there. Especially, this is imperative necessity because a resistivity of the N− drain layer 3 rises when the carrier lifetime is shortened in the N− drain layer 3 by putting lifetime killer in to implement a high-speed operation of the IGBT.

Figure 5:
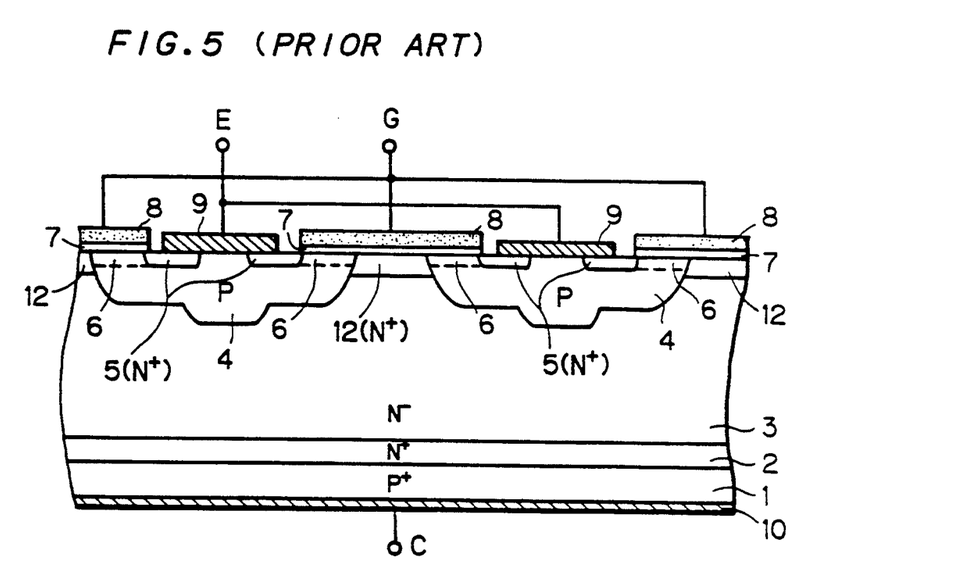
Figure 6A:
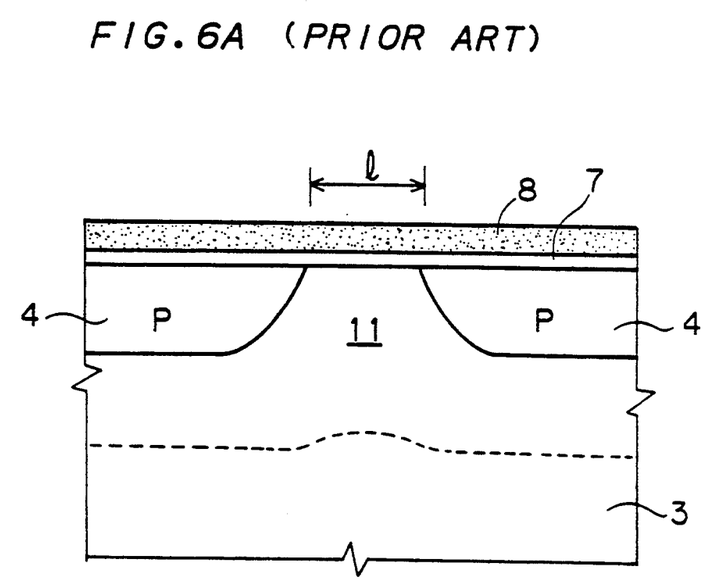
FIGS. 6A and 6B are diagrams for explaining disadvantages in the prior art.
Figure 6B:
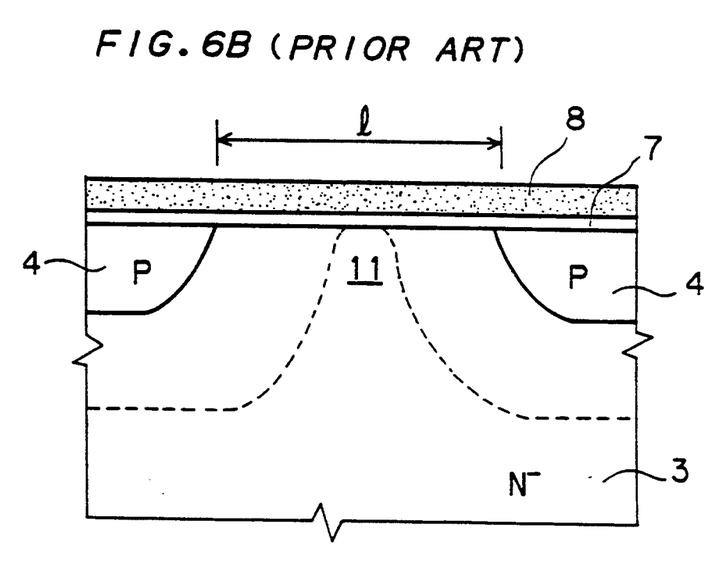

To make the current flow more easily through the region 11 in the vertical direction, for example, the width l of the region 11 is made wider or the impurity in the region 11 is increased to make an N+ region 12, so as to reduce a value R of the resistance there (FIG. 5). However, making the width l too large or making the resistance value R too small, the withstand voltage retained while the device turns off is reduced. Specifically, depletion layers expand from the P base regions 4 into the N− layer 3 with an increase in forward bias; however, when the width l is small, the depletion layers from opposite sides join together at a relatively low voltage to moderate the electric field around, as shown by the broken line in FIG. 6A. Meanwhile, when the width l is large, the depletion layers do not easily join as shown in FIG. 6B, much more concentration of the electric field around the region 11 is caused, and the device is broken down. When the resistance value R becomes too small, the same phenomenon leads to a decline of the withstand voltage.

Thus, in the conventional IGBT, there arises the problem that it is difficult to reduce ON-voltage without reducing the withstand voltage.

SUMMARY OF THE INVENTION

According to the present invention, a semiconductor device which comprises a first semiconductor layer of a first conductivity type having upper and lower major surfaces; a second semiconductor layer of a second conductivity type formed on the upper major surface of the first semiconductor layer; a third semiconductor layer of the first conductivity type formed in a top surface of the second semiconductor layer; at least one fourth semiconductor layer of the second conductivity selectively formed and buried in the third semiconductor layer; at least one fifth semiconductor layer of the second conductivity type selectively formed in a top surface of the third semiconductor layer, the fifth semiconductor layer being displaced above the fourth semiconductor layer, wherein at least one trench extending from a top surface of the fifth semiconductor layer into the fourth semiconductor layer is formed through the third and fifth semiconductor layers; an insulating layer formed on an inner wall of the trench; a control electrode formed on the insulating layer in the trench; a first main electrode layer being in contact with both the top surface of the third semiconductor layer and the top surface of the fifth semiconductor layer; and a second main electrode layer formed on the lower major surface of the first semiconductor layer.

In a preferred embodiment, the second semiconductor layer is formed by a first region of the second conductivity type having a relatively low resistivity and formed on the top major surface of the first semiconductor layer; and a second region of the second conductivity type having a relatively high resistivity and formed on a top surface of the first region, the third semiconductor layer being provided in a top surface of the second region of the second conductivity type.

The third semiconductor layer may comprise: a first region of the first conductivity type having a relatively high resistivity and selectively formed in the second region of the second conductivity type; and a second region of the first conductivity type having a relatively low resistivity and formed on a top surface of the first region of the first conductivity type. The fourth semiconductor layer is located in the top surface of the first region of the first conductivity type, and the fifth semiconductor layer is located in a top surface of the second region of the first conductivity type.

The present invention is also directed to a method of manufacturing a semiconductor device. According to the present invention, the method comprises the steps of: obtaining a first semiconductor layer of a first conductivity type having top and bottom major surfaces; (b) forming a first part of a second semiconductor layer of a second conductivity type on an upper major surface of the first semiconductor layer of a first conductivity type; (c) forming a first part of a third semiconductor layer of the first conductivity type in a top surface of the first part of the second semiconductor layer; (d) selectively forming at least one fourth semiconductor layer of the second conductivity type in a top surface of the first part of the third semiconductor layer; (e) forming a second part of the third semiconductor layer of the first conductivity type on respective top surfaces of the first part of the third semiconductor layer and the fourth semiconductor layer; (f) selectively forming at least one fifth semiconductor layer of the second conductivity type in a top surface of the second part of the third semiconductor layer, the fifth semiconductor layer being located above the fourth semiconductor layer; (g) forming at least one trench which extends from a top surface of the fifth semiconductor layer into the fourth semiconductor layer through the fifth semiconductor layer and the second part of the third semiconductor layer; (h) forming an insulating layer and a control electrode in this order on an inner wall of the trench; (i) forming a first main electrode layer which contacts both the top surface of the second part of the third semiconductor layer and the top surface of the fifth semiconductor layer; and (j) forming a second main electrode layer on the lower major surface of the first semiconductor layer.

Preferably, the step (e) comprises the steps of: (e-1) forming a sixth semiconductor layer of the second conductivity type on a top surface of a structure obtained through the steps (a) to (d); and (e-2) selectively introducing first conductivity type dopants into the sixth semiconductor layer to obtain the second part of the third semiconductor layer.

In a semiconductor device according to the present invention, a thyristor consisting of first to fourth semiconductor layers is controlled through a vertical MOS constitution where a fifth semiconductor layer serves as a source, an area contiguous to a trench in a third semiconductor layer serves as a channel region, and a fourth semiconductor layer serves as a drain. When the device is turned on, current easily flows as the current in the vertical direction flows with a width equal to the width of the fourth semiconductor layer; and therefore, there is an effect that an insulated-gate bipolar mode semiconductor device can be obtained which has a low ON-voltage even on the conditions of a high speed and a high withstand voltage.

According to a method of manufacturing a semiconductor device in another aspect of the present invention, there is an effect that an insulated-gate bipolar mode semiconductor device having the above-mentioned characteristics can be obtained.

Accordingly, it is an object of the present invention to provide an insulated-gate bipolar semiconductor device in which ON-voltage is low even on the conditions of a high speed and a high withstand voltage and to provide a method of manufacturing the same.

These and other objects, features, aspects and advantages of the present ivention will become more apparent from the following detailed description of the present invention when taken in conjunction with the accompanying drawings.

BRIEF DESCRIPTION OF THE DRAWINGS

In the drawings, like reference numerals denote identical or corresponding parts.

DETAILED DESCRIPTION OF THE PREFERRED EMBODIMENT

Figure 1A:
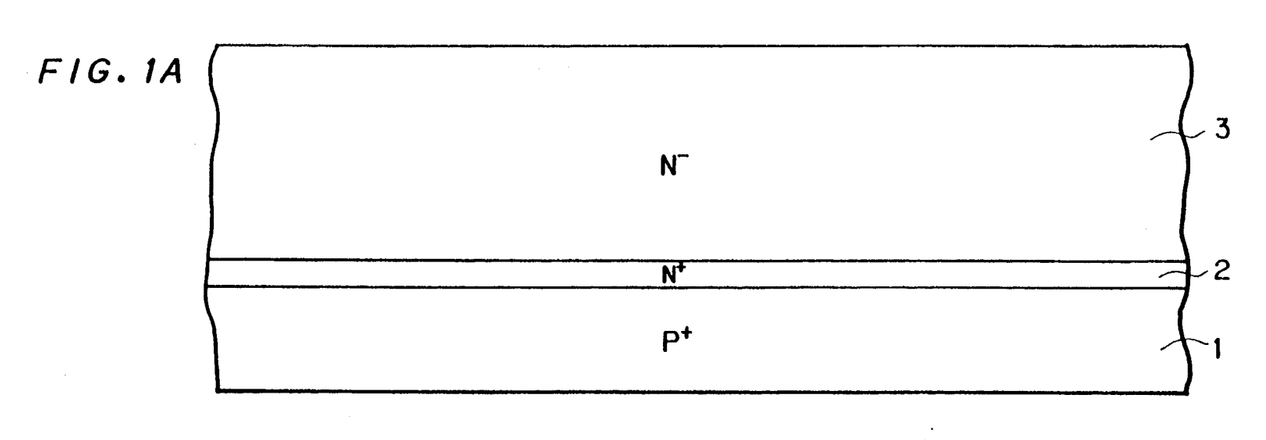
FIGS. 1A to 1G are sectional views for explaining a process in an aspect of the present invention.
Figure 1B:
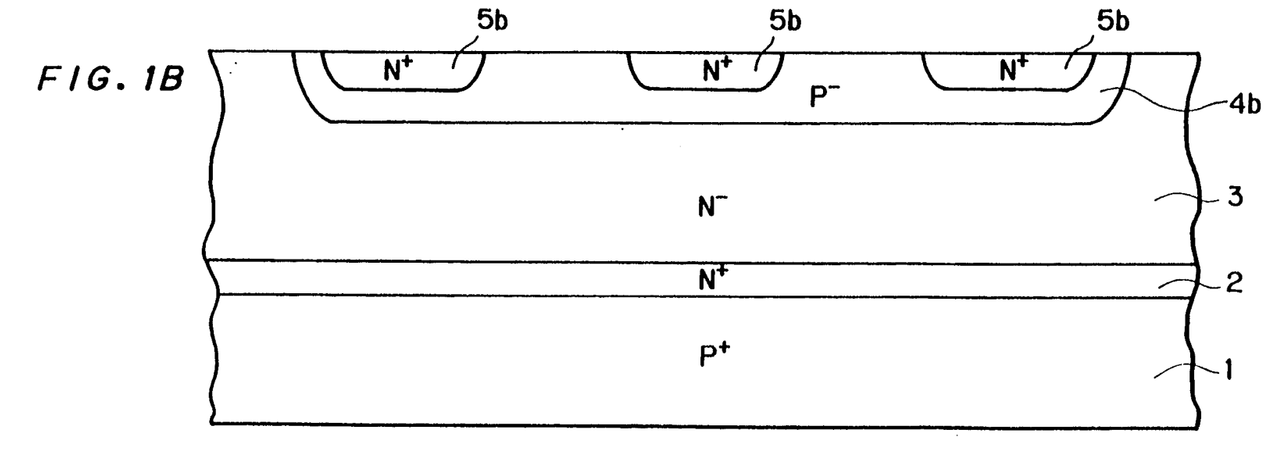
Figure 1C:
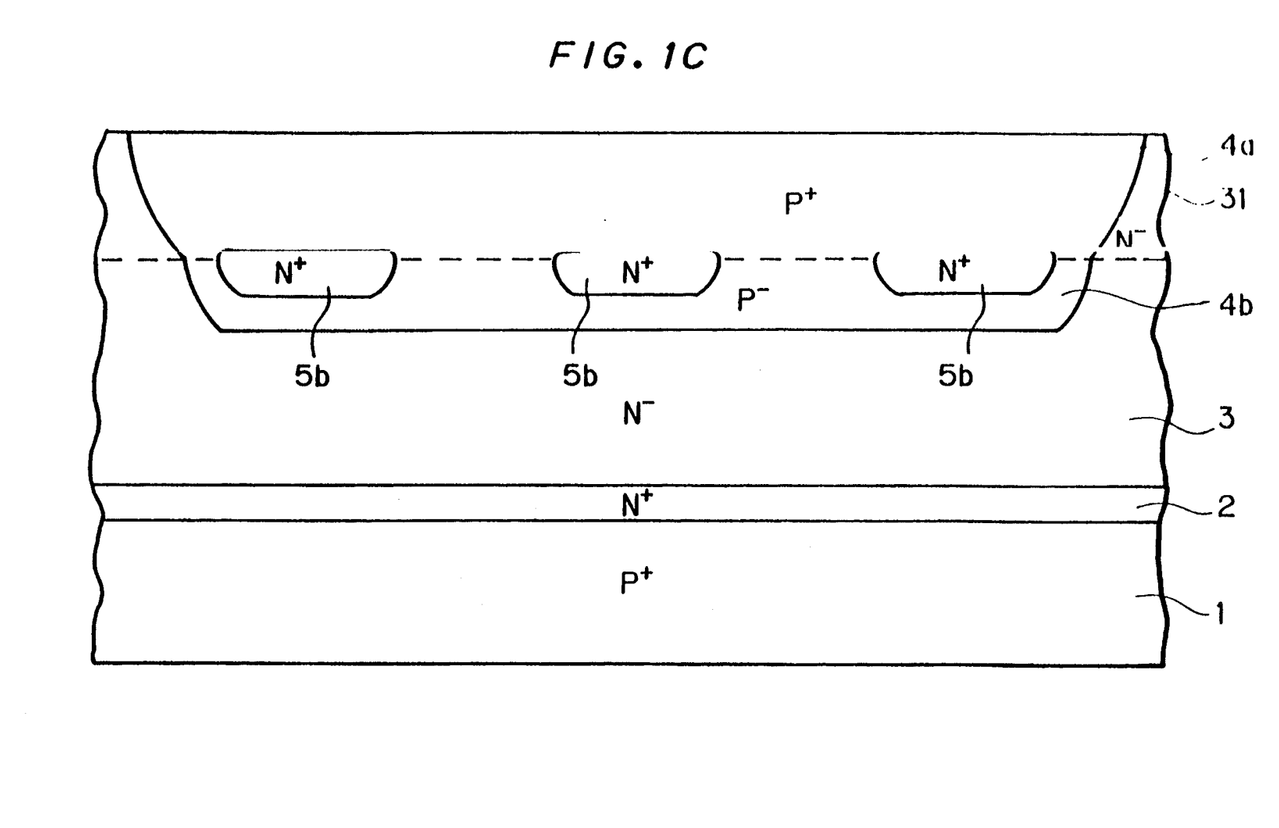
Figure 1D:
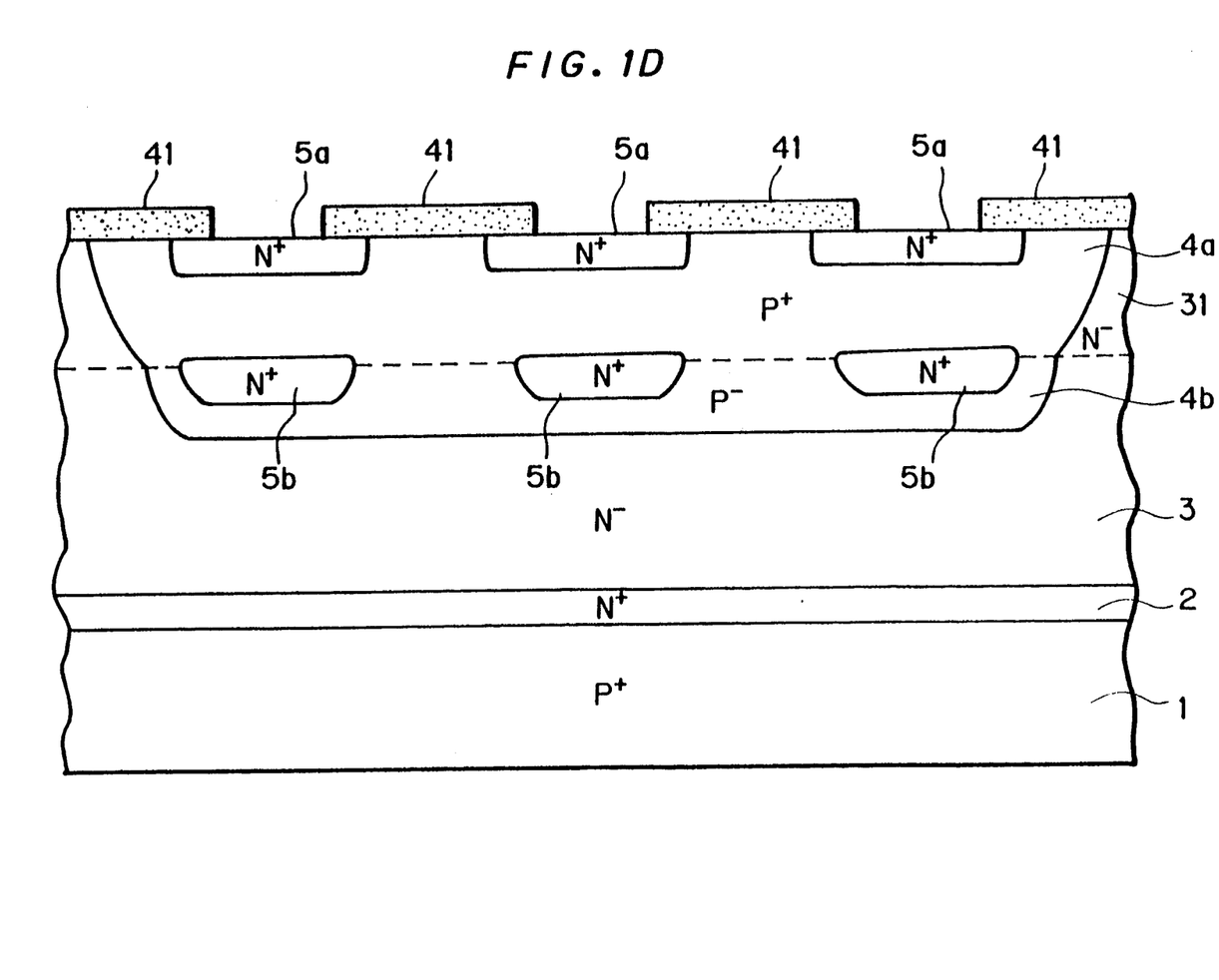
Figure 1E:
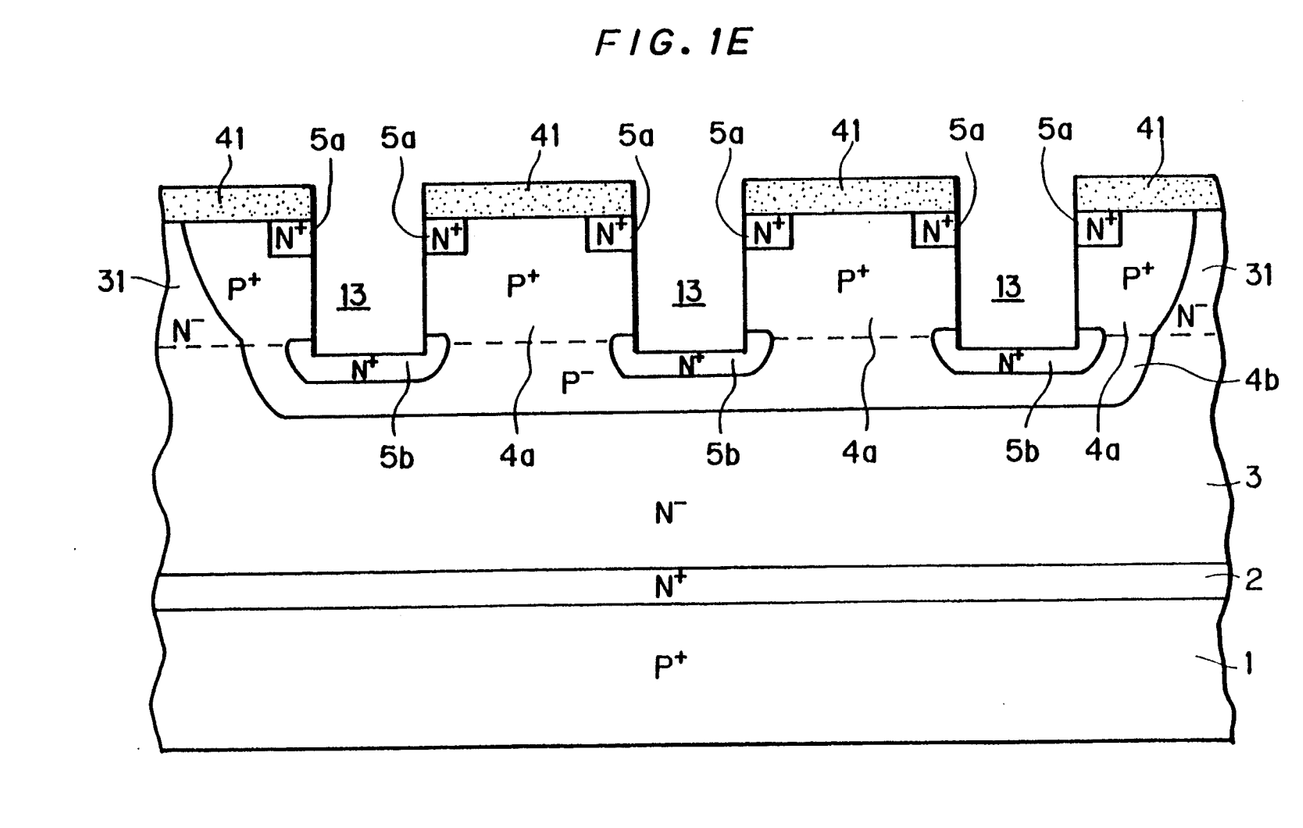
Figure 1F:
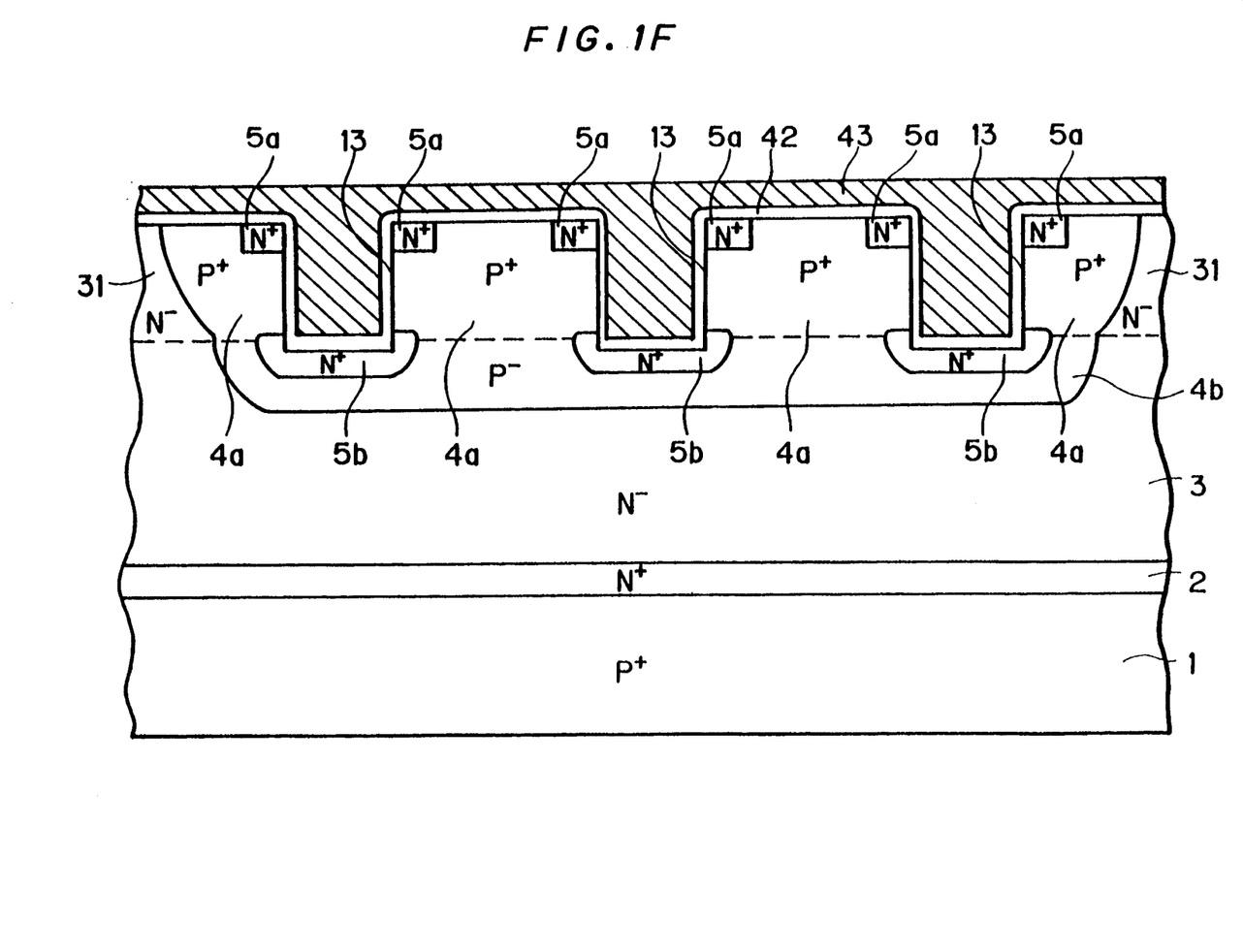
Figure 1G:
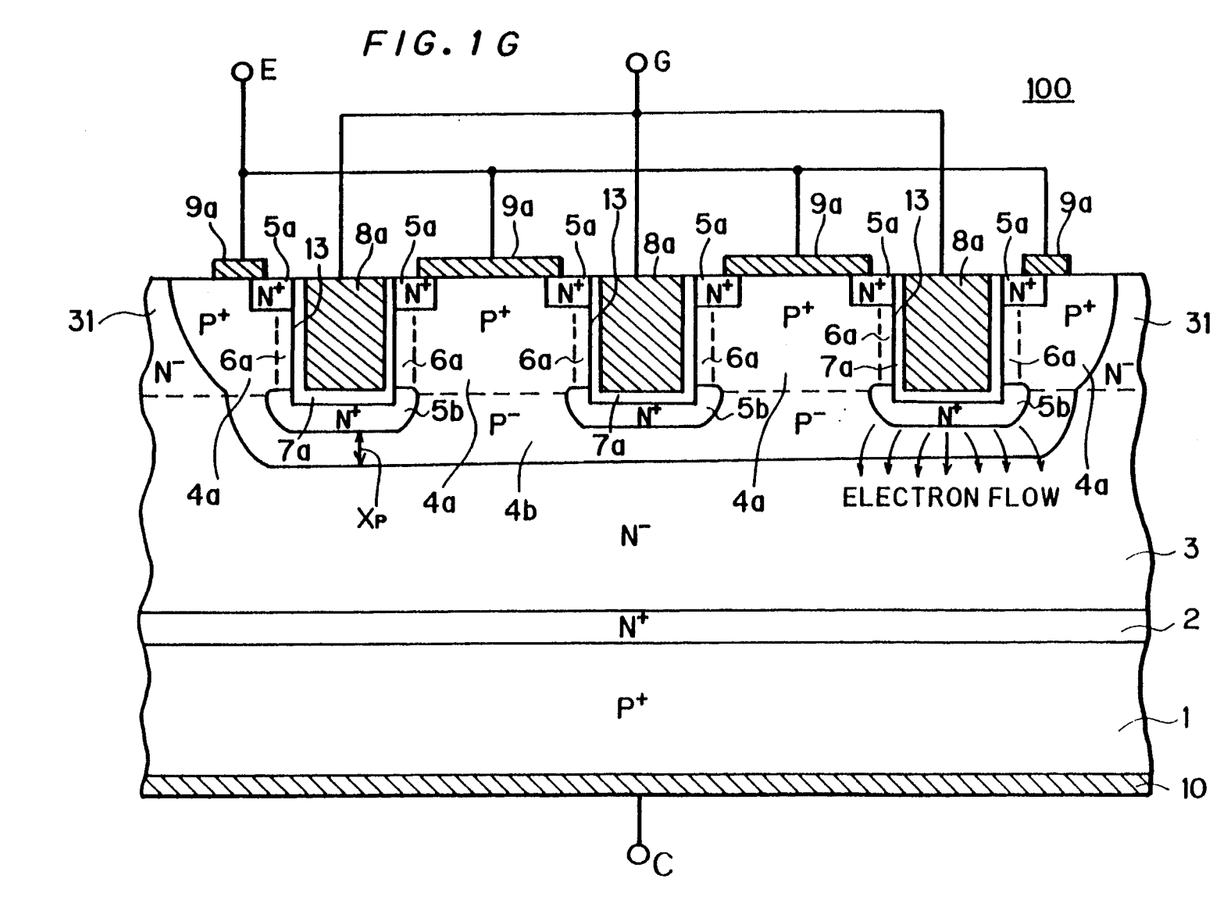

FIG. 1G is a sectional view showing a semiconductor device 100 which is a preferred embodiment according to the present invention. An N+ buffer layer 2 and an N− layer 3 are provided on an upper major surface of a P+ silicon substrate 1 in this order. On an upper portion of the N− layer 3, a P− layer 4b is selectively formed, and on the P− layer 4b, a P+ layer 4a is provided. On part of a top surface of the P+ layer 4a, a plurality of N+ layers 5a are provided, and a trench 13 is formed extending through each of the N+ layers 5a and P+ layer 4a downwards to the P− layer 4b. In the P− layer 4b, an N+ floating layer 5b is provided covering the bottom face of each trench 13. In the inner hollow of the trench 13, a gate electrode 8a is provided through a gate oxidation film 7a, while an emitter electrode 9a is provided extending between the top surfaces of the adjacent N+ layers 5a with the surface of the P+ layer 4a interposed so as to electrically short circuiting them. A collector electrode 10 is provided on a lower major surface of the P+ substrate 1.

The semiconductor device is an electrically-integrated device of (1) an NPN thyristor constitution consisting of the N+ floating layers 5b, the P− layer 4b, the N− layer 3, the N+ layer 2 and the P+ substrate 1 with (2) a MOS transistor in which the N+ layer 5a and the N+ floating layer 5b serve as source and drain regions, respectively, while a region 6a contiguous to the side wall face of the trench 13 between the N+ layer 5a and the N+ floating layer 5b in the P+ layer 4a serves as a channel region. An impurity concentration and a thickness of each of the individual layers will be mentioned later.

Then, the operation of the device will be described. When a higher potential than that of the emitter electrode 9a is applied to the gate electrode 8a with forward bias being applied between the electrodes 9a and 10 so that the collector electrode 10 may be higher in potential than the emitter electrode 9a, the channel region 6a turns to the N-type, and electrons move from the N+ layers 5a through the channels 6a to the N+ floating layers 5b. In this practice, since a positive voltage is applied to the collector electrode 10, the N− layer 3 and the P− layer 4b are reverse-biased, and a depletion layer expands from the N−layer 5b upwards in the P− layer 4b. When an amount of the expansion of the depletion layer reaches a width $X_p$ of the P−layer 4b in the vertical direction under the N+ layer 5b to establish a reach-through toward the N+ floating layer 3, the electrons moving into the N+ floating layers 5b pass the depletion layer and they are accelerated and moved into the N− layer 3. In accord with this, holes are moved from the P+ substrate 1 through the N+ buffer layer 2 into the N− layer 3 and eventually into the P− layer 4b. This leads a thyristor formed of the N+ floating layers 5b, the P− layer 4b, the N- layer 3, the N+ layer 2 and the P+ substrate 1 to turn ON, and a current caused by an effect of the thyristor flows in the direction almost perpendicular to the major surfaces of the P+ substrate 1. FIG. 1G shows the state on its right side configuration, where the arrows indicate the flow of electrons. As will be recognized, a width of a passage for the electrons moving in is almost a lateral width of the N+ floating layer 5b, and since the width of the passage is larger compared with that in the conventional IGBT, current can flow more easily, and the ON-voltage can be reduced.

On the other hand, when the device is turned off, depletion layers expand upwards and downwards from an interface between the P− layer 4b and the N− layer 3. Even if the depletion layer expanding upwards in the P− layer 4b reaches the N+ floating layer 5b, a conversion of the channel region 6a into the N-type is not caused, and therefore, the reach-through between the N+ floating layer 5b and the N+ layer 5a is not easily established. Also, as to the depletion layer expanding downwards in the N− layer 3, no local distortion as shown in FIG. 6B is caused. This is why a high withstand voltage can be retained in the device of this embodiment. Additionally, since the width of the passage for electrons moving in is large, the ON-voltage can be kept low even with an existence of a certain amount of lifetime killer, and an insulated-gate bipolar semiconductor device 100 can be obtained which has a low ON-voltage even under the conditions of a high operation speed and a high withstand voltage.

In the above embodiment, it is necessary for an impurity concentration in the P+ layer 4a to be maintain large to some extent so that the operation of a parasitic transistor caused by carriers moving in from the N− layer 5a may be inhibited. Meanwhile, the P+ layer 4a must be converted into the N-type near the trench 13 when several volts is applied to the gate electrode 8a, and therefore, the impurity concentration cannot be enhanced so much. Thus, it is desirable to keep the impurity concentration at approximately $1 \times 10^{16}$ to $1 \times 10^{17}$ cm$^{-3}$.

In addition to that, it is necessary to set the thickness $X_p$ and the impurity concentration of the P− layer 4b so that the depletion layer expanding in the P− layer 4b reaches the N+ floating layer 5b when several volts of forward bias is applied between the emitter electrode 9a and the collector electrode 10. Desirably, the width $X_p$ may be approximately 1.0 to 1.5 μm while the impurity concentration of the P− layer 4b may be approximately $1 \times 10^{14}$ to $1 \times 10^{15}$ cm$^{-3}$ near the interface with the N− layer 3.

Figure 2:
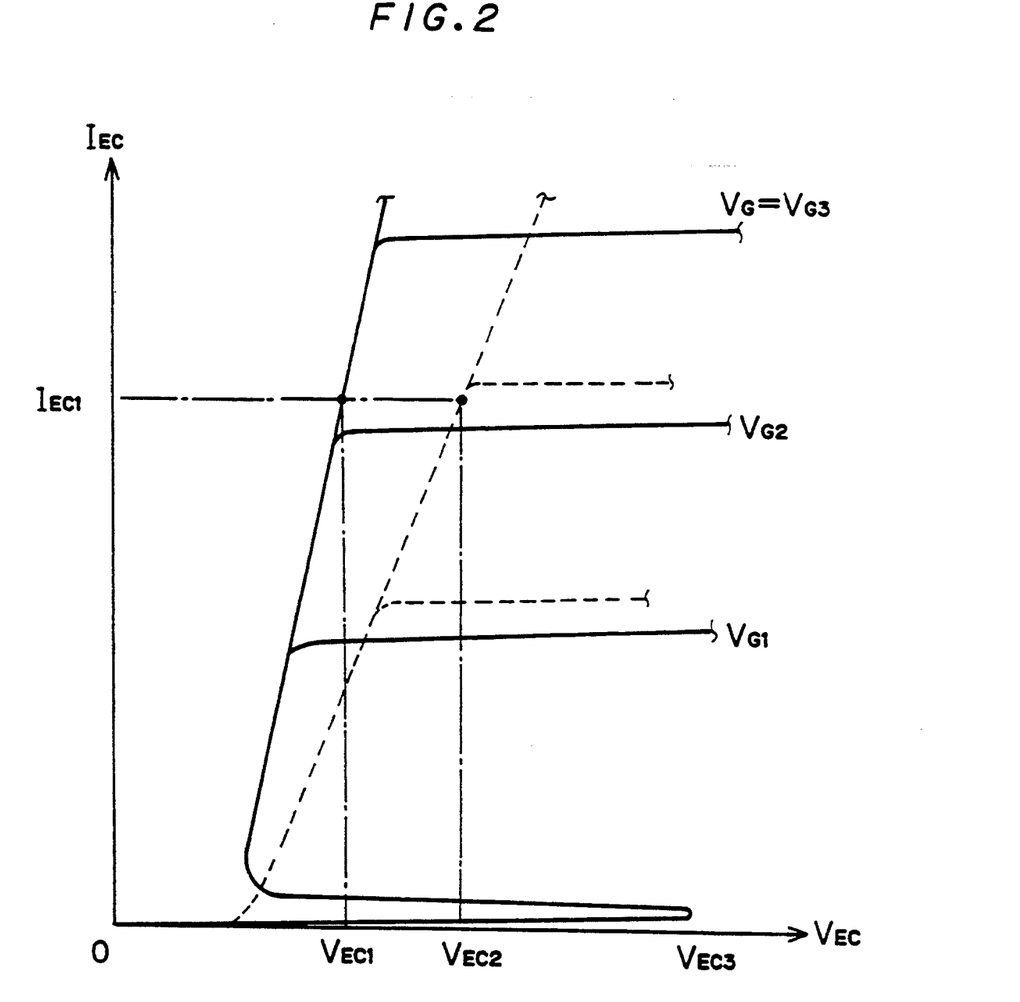
FIG. 2 is a graph expressing characteristics of a semiconductor device which is an embodiment according to the present invention.

FIG. 2 is a diagram showing voltage/current characteristics between the emitter and the collector of the semiconductor device 100 in FIG. 1G with several values $V_{G1}$, $V_{G2}$, $V_{G3}$, and so on of the gate voltage $V_G$ and also showing characteristics of the conventional IGBT by the broken line for a comparison. In the device 100 in FIG. 1G, when the emitter-collector voltage $V_{EC}$ is raised fixing the gate voltage $V_G$, the device turns ON on the condition of $V_{EC}=V_{EC3}$. The turn-on voltage (or finger voltage, latch-on voltage) $V_{EC3}$ is about 5 volts, for example. ON-voltage of the semiconductor device 100 when the emitter-collector current $I_{EC}$ has a specified value $I_{EC1}$, and ON-voltage $V_{EC2}$ of the conventional IGBT related to the identical current value $I_{EC1}$ are shown in FIG. 2. For example, the voltage value $V_{EC1}$ is about 2 volts while the voltage value $V_{EC2}$ is about 3 volts, and it is apparent that the ON-voltage of the semiconductor device 100 is considerably lower than that of the conventional IGBT.

Figure 3:
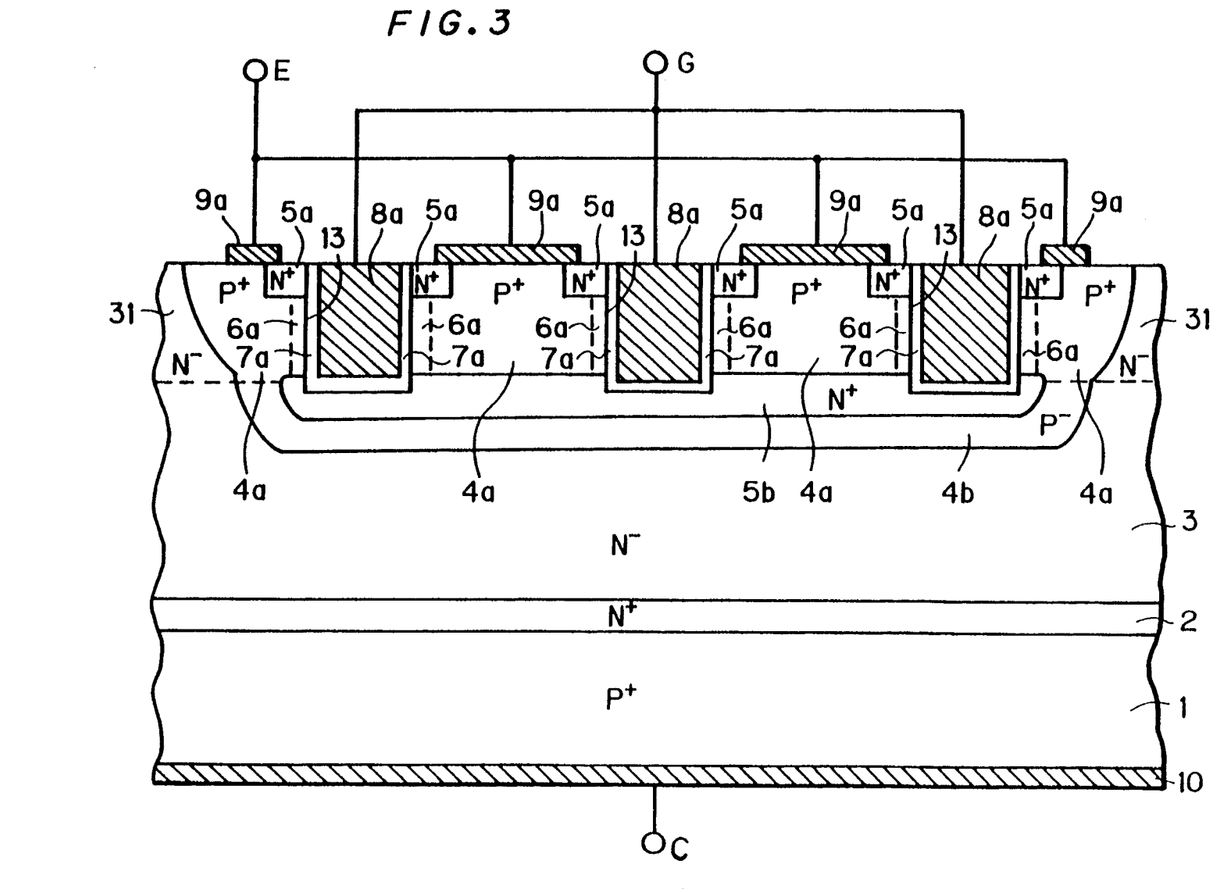
FIG. 3 is a sectional view showing another embodiment according to the present invention.

While, in the above embodiment, the N+ buffer layer 2 is provided for a higher speed operation, the present invention attains similar effects without it. Also while, in the foregoing embodiment, the N+ floating layers 5b are formed in the shape of islands isolated from one another corresponding to the MOS constitution, similar effects can be attained even if the N+ floating layer 5b in the shape of a single island extends linking the trenches 13 together as shown in FIG. 3.

Then, a method of manufacturing the semiconductor device 100 having the foregoing configuration will be described with reference to FIGS. 1A to 1G.

First, as shown in FIG. 1A, on a surface of the P+ silicon substrate 1 of resistivity 0.005 to 0.02 Ωcm, the N+ buffer layer 2 of resistivity 0.1 to 0.5 Ωcm is formed in a thickness 10 to 30 μm by epitaxial growth. Then, on the N+ buffer layer 2, the N− layer 3 of resistivity several tens Ωcm is formed in a thickness of several tens μm and one hundred and several tens μm by the epitaxial growth.

Moreover, the P− layer (well) 4b is formed by selective diffusion of an P-type impurity or by ion implantation, and the N+ floating layers 5b are formed by selective diffusion of an N-type impurity or by ion implantation (FIG. 1B).

Over the whole surface of a wafer which has gone through the foregoing process steps, the N− layer 31 of resistivity several tens Ωcm is formed in thickness about 10 μm by the epitaxial growth, and the P+ layer 4a is formed by selective diffusion of the P-type impurity or ion implantation from the surface into the N− layer 31 (FIG. 1C).

Furthermore, the N+ layers 5a are formed above the individual N+ layers 5b by selective ion implantation of the N-type impurity into a top surface of the P+ layer 4a (FIG. 1D). Then, a resist layer is formed over the whole top surface of the wafer and it is patterned to make mask layers 41. Part of the wafer is selectively removed by dry etching, such as RIE and the like, using the mask layers 41, so as to obtain the trenches 13 extending through the N+ layers 5a and P+ layers 4a down to the N+ floating layers 5b (FIG. 1E).

Then, the mask layers 41 are removed and a silicon oxide film 42 is formed over the whole top surface of the wafer as well as inside the trenches 13 as shown in FIG. 1F; and additionally, a polysilicon layer 43 is provided on the whole top surface of the wafer so as to fill the hollows of the trenches 13. Then, upper part of the polysilicon layer 43 and silicon oxide film 42 is etched away so that the upper face of the N+ layer 5a and the upper face of the P+ layer 4a may be exposed, and thus, the gate electrodes 8a and gate oxide films 7a are obtained.

Then, AlSi layers 44 is formed on the N+ layers 5a and P+ layers 4a to serve as emitter electrodes 9a while a conductive layer 45 of three-stratum structure of Ti—Ni—Au is formed on a lower major surface of the P+ substrate 1 to serve as the collector electrode 10. Creating the electrical connections between the emitter electrodes 9a and between the gate electrodes 8a, respectively, the semiconductor device 100 is obtained.

When a semiconductor device shown in FIG. 3 is manufactured, a single N+ floating layer 5b is substituted for the N+ floating layers 5b shown in FIGS. 1B to 1G in the corresponding manufacturing process.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a semiconductor device, comprising the steps of:
   (a) obtaining a first semiconductor layer of a first conductivity type having top and bottom major surfaces;
   (b) forming a first part of a second semiconductor layer of a second conductivity type on an upper major surface of said first semiconductor layer of a first conductivity type;
   (c) forming a first part of a third semiconductor layer of the first conductivity type in a top surface of said first part of said second semiconductor layer;
   (d) selectively forming at least one fourth semiconductor layer of the second conductivity type in a top surface of said first part of said third semiconductor layer;
   (e) forming a second part of said third semiconductor layer of the first conductivity type on respective top surfaces of said first part of said third semiconductor layer and said fourth semiconductor layer;
   (f) selectively forming at least one fifth semiconductor layer of the second conductivity type in a top surface of said second part of said third semiconductor layer, said fifth semiconductor layer being located above said fourth semiconductor layer;
   (g) forming at least one trench which extends from a top surface of said fifth semiconductor layer into said fourth semiconductor layer through said fifth semiconductor layer and said second part of said third semiconductor layer;
   (h) forming an insulating layer and a control electrode in this order on an inner wall of said trench;
   (i) forming a first main electrode layer which contacts both said top surface of said second part of said third semiconductor layer and said top surface of said fifth semiconductor layer; and
   (j) forming a second main electrode layer on said lower major surface of said first semiconductor layer.

2. A method of fabricating a semiconductor device in accordance with claim 1, wherein
   said step (b) comprises the steps of:
   (b-1) forming a first semiconductor region of the second conductivity type having a first resistivity on said first semiconductor layer; and
   (b-2) forming a second semiconductor region of the second conductivity type having a second resistivity, which is higher than said first resistivity, on said first semiconductor region of the second conductivity type.

3. A method of fabricating a semiconductor device in accordance with claim 2, wherein
   said step (c) comprises the step of:
   (c-1) introducing first conductivity type dopants into said second semiconductor region of the second conductivity type from an top surface thereof to obtain said first part of said third semiconductor layer.

4. A method of fabricating a semiconductor device in accordance with claim 3, wherein
   said step (e) comprises the steps of:
   (e-1) forming a sixth semiconductor layer of the second conductivity type on a top surface of a structure obtained through the steps (a) to (d); and
   (e-2) selectively introducing first conductivity type dopants into said sixth semiconductor layer to obtain said second part of said third semiconductor layer.

5. A method of fabricating a semiconductor device in accordance with claim 4, wherein
   said step (d) comprises the step of:
   (d-1) forming a first plurality of semiconductor islands of the second conductivity type in said top surface of said first part of said third semiconductor layer, wherein said first plurality of semiconductor islands are isolated from each other and constitute said fourth semiconductor layer.

6. A method of fabricating a semiconductor device in accordance with claim 5, wherein
   said step (f) comprises the step of:
   (f-1) forming a second plurality of semiconductor islands of the second conductivity type in said top surface of said second part of said third semiconductor layer, wherein said second plurality of semiconductor islands are aligned with said first plurality of semiconductor islands, respectively, and constitute said fifth semiconductor layer.

7. A method of fabricating a semiconductor device in accordance with claim 6, wherein
   said step (g) comprises the step of:
   (g-1) forming a plurality of unit trenches which extend from respective top surfaces of said second plurality of semiconductor islands into said first plurality of semiconductor islands through said second plurality of semiconductor islands and said second part of said third semiconductor layer, respectively.

8. A method of fabricating a semiconductor device in accordance with claim 6, wherein
   said step (f) comprises the step of:
   (f-2) forming a plurality of plane semiconductor islands of the second conductivity type in said top surface of said second part of said third semiconductor layer, wherein said plurality of semiconductor islands are arranged with intervals therebetween above said single plane semiconductor island and serves as said fifth semiconductor layer.

9. A method of fabricating a semiconductor device in accordance with claim 8, wherein
   said step (g) comprises the step of:
   (g-2) forming a plurality of unit trenches which extend from respective top surfaces of said plurality of semiconductor islands into said single plane semiconductor island through said plurality of semiconductor islands and said second part of said third semiconductor layer, respectively.

10. A method of fabricating a semiconductor device in accordance with claim 4, wherein
    said step (d) comprises the step of:
    (d-2) forming a single plane semiconductor island of the second conductivity type in said top surface of said first part of said third semiconductor layer, said single plane semiconductor layer serving as said fourth semiconductor layer.

11. A method of fabricating a semiconductor device in accordance with claim 4, wherein said step (h) comprises the steps of:

(h-1) forming an insulating film which entirely covers a top surface of a structure fabricated through said steps (a) to (g);
(h-2) entirely covering said insulating film with electrode material; and
(h-3) selectively removing said insulating film and said electrode material in the area which is not located in said trench to obtain said insulating layer and said first main electrode.

* * * * *